United States Patent
Kim et al.

(10) Patent No.: US 8,429,327 B2
(45) Date of Patent: Apr. 23, 2013

(54) MAPPING APPARATUS AND METHOD FOR NON-VOLATILE MEMORY SUPPORTING DIFFERENT CELL TYPES

(75) Inventors: Jin-kyu Kim, Seoul (KR); Kyoung-il Bang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 830 days.

(21) Appl. No.: 11/754,563

(22) Filed: May 29, 2007

(65) Prior Publication Data
US 2008/0077729 A1  Mar. 27, 2008

(30) Foreign Application Priority Data
Sep. 27, 2006  (KR) .................. 10-2006-0094297

(51) Int. Cl.
*G06F 13/00* (2006.01)
*G06F 13/28* (2006.01)

(52) U.S. Cl.
USPC .................................. 711/103; 711/E12.008

(58) Field of Classification Search ............ 711/E12.008
See application file for complete search history.

(56) References Cited

U.S. PATENT DOCUMENTS

| | | | |
|---|---|---|---|
| 5,671,388 A | 9/1997 | Hasbun | |
| 5,812,447 A | 9/1998 | Inoue | |
| 5,930,167 A | 7/1999 | Lee et al. | |
| 5,966,326 A | 10/1999 | Park et al. | |
| 6,363,009 B1 | 3/2002 | Fukuzumi et al. | |
| 6,456,528 B1 | 9/2002 | Chen | |
| 6,728,133 B2 | 4/2004 | Shimizu et al. | |
| 7,177,184 B2 | 2/2007 | Chen | |
| 7,554,842 B2 | 6/2009 | Barziliai et al. | |
| 2003/0007384 A1* | 1/2003 | Shimizu .................... 365/185.03 | |
| 2006/0161724 A1* | 7/2006 | Bennett et al. ................. 711/103 | |

FOREIGN PATENT DOCUMENTS

| | | |
|---|---|---|
| JP | 11-31102 A | 2/1999 |
| JP | 2000-173281 A | 6/2000 |
| JP | 2001-306393 A | 11/2001 |
| JP | 2003-22687 A | 1/2003 |
| JP | 2004-062328 A | 2/2004 |

(Continued)

OTHER PUBLICATIONS

Office Action issued Jan. 18, 2011 in counterpart Japanese Application No. 2007-245073.
Japanese Office Action issued on Sep. 13, 2011 in the corresponding Japanese Patent Application No. 2007-245073.
Communication issued May 17, 2011, in corresponding Japanese Application No. 2007-245073.

(Continued)

*Primary Examiner* — Edward Dudek, Jr.
(74) *Attorney, Agent, or Firm* — Sughrue Mion, PLLC

(57) ABSTRACT

Present invention relates to a mapping apparatus and method for a non-volatile memory supporting different cell types, and more particularly, to a mapping apparatus and method for a non-volatile memory supporting different cell types capable of mapping a logical address to a physical address in the non-volatile memory supporting different cell types in which bits represented by unit cells are different from each other.
A mapping apparatus for a non-volatile memory supporting different cell types according to an embodiment of the invention includes: a user request unit used for a user to request a predetermined operation by using a logical address; a non-volatile memory comprising a plurality of memory areas having different cell types; and a mapping management unit determining a physical address to be mapped to the logical address of one of the plurality of memory areas on the basis of the logical address used for the requested operation.

18 Claims, 7 Drawing Sheets

FOREIGN PATENT DOCUMENTS

| | | | |
|---|---|---|---|
| KR | 1998-021156 | A | 6/1998 |
| KR | 1999-0079926 | A | 11/1999 |
| WO | 2005066770 | A2 | 7/2005 |
| WO | 2005069288 | A1 | 7/2005 |
| WO | 2005101211 | A1 | 10/2005 |

OTHER PUBLICATIONS

Cho et al. "A Dual-Mode NAND Flash Memory: 1-Gb Multilevel and High-Performance 512-Mb Single Level Modes." IEEE Journal of Solid-State Circuits, Issue. 11, vol. 36, pp. 1700-1706, Nov. 2001.

* cited by examiner

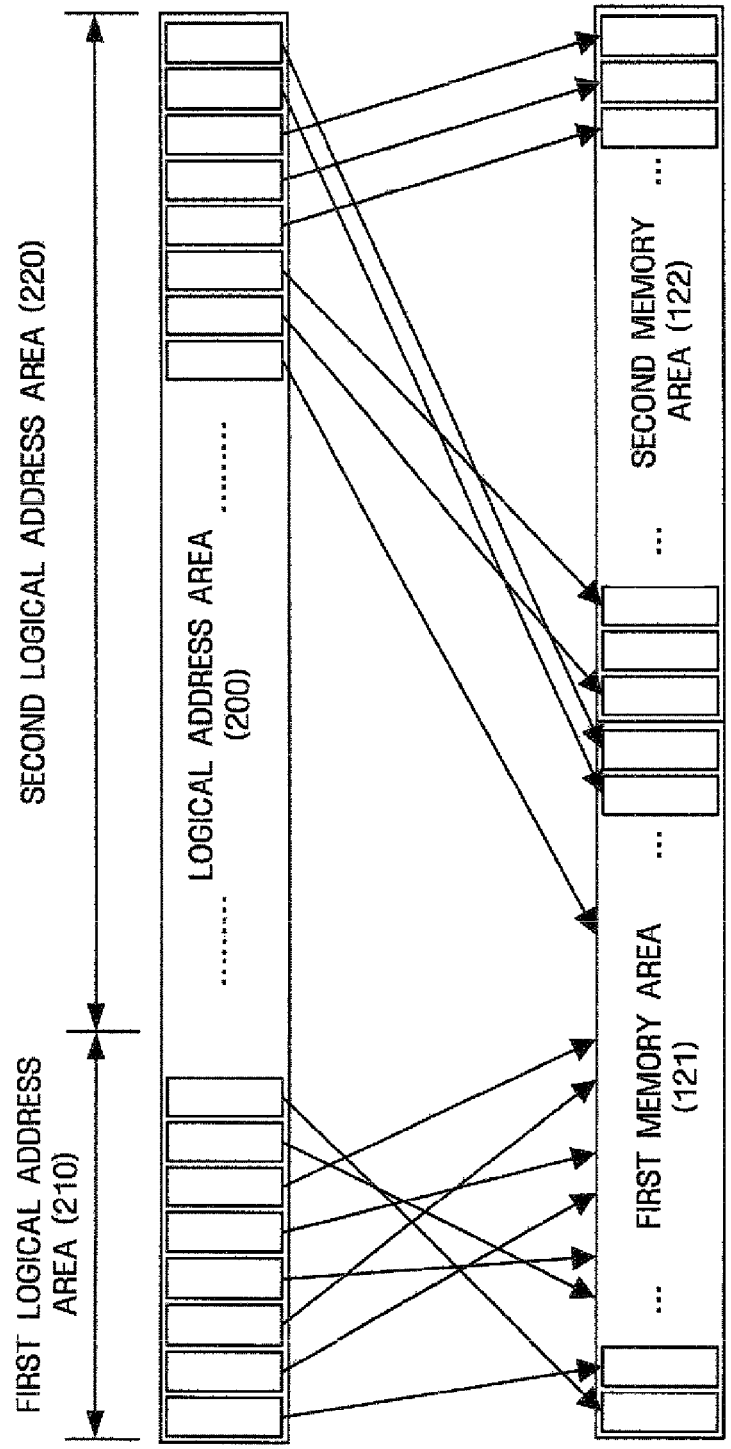

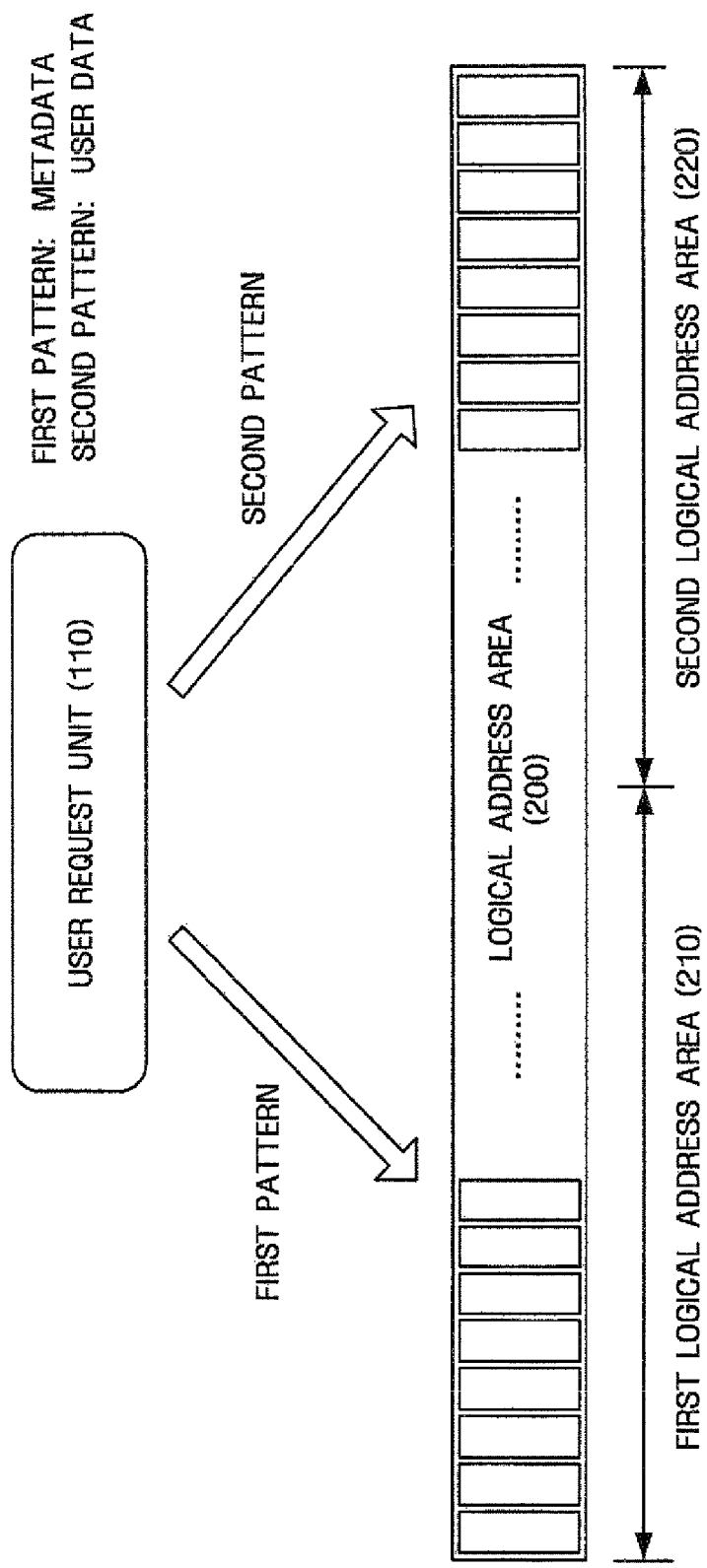

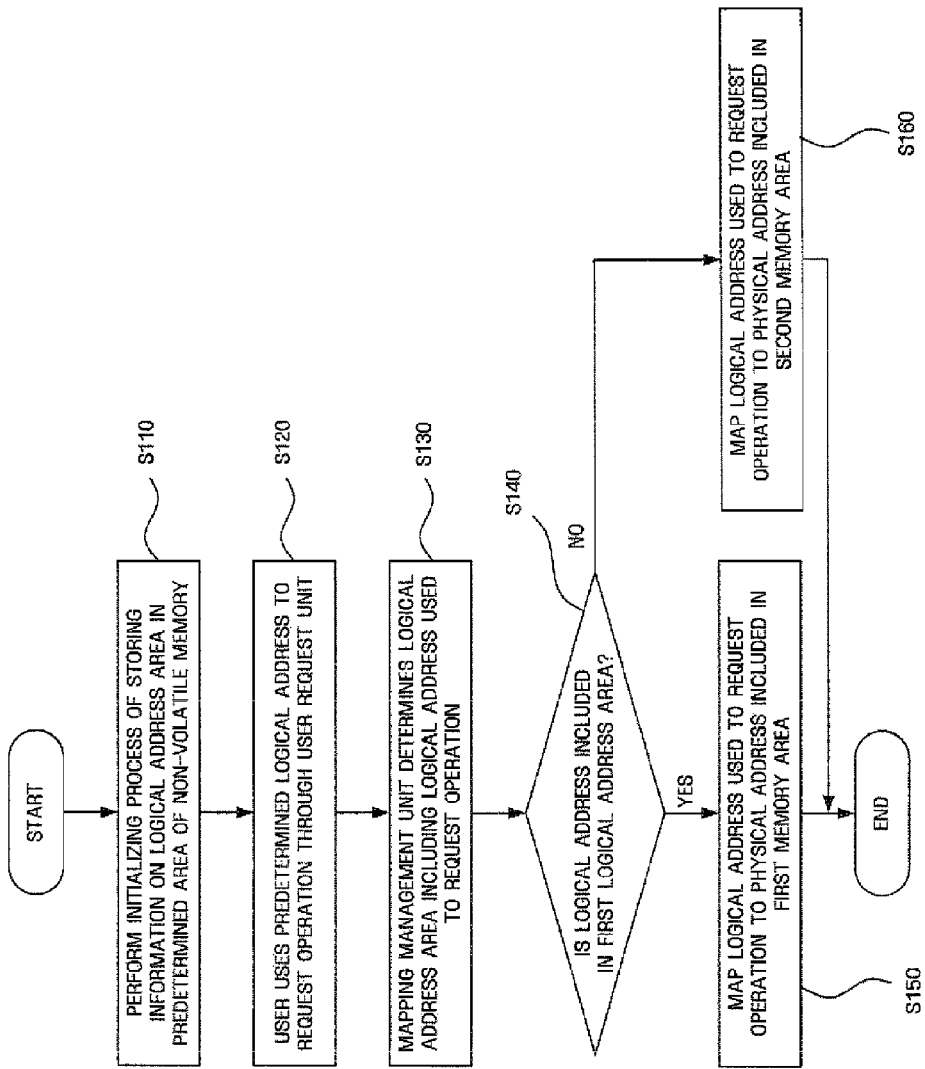

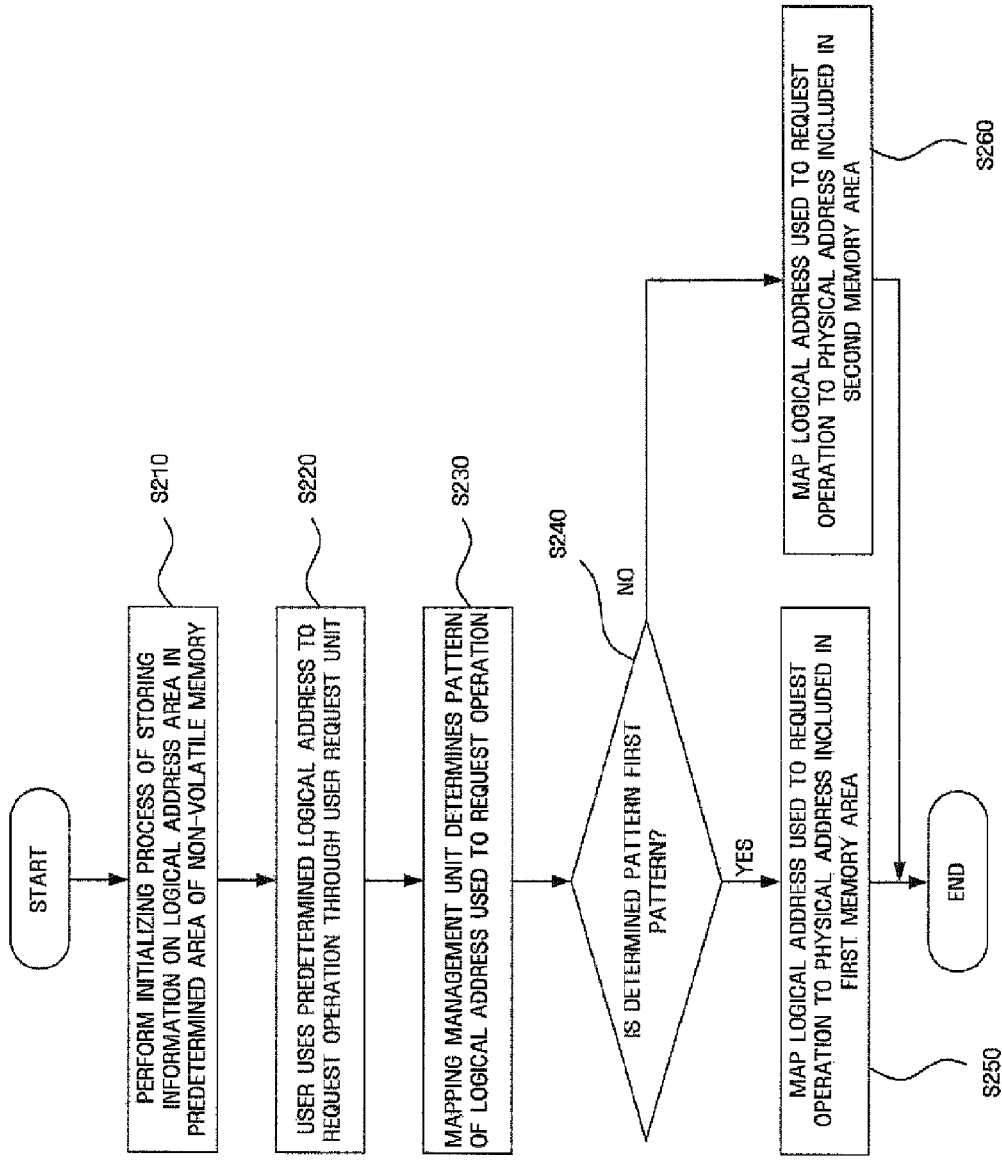

MAPPING APPARATUS AND METHOD FOR NON-VOLATILE MEMORY SUPPORTING DIFFERENT CELL TYPES

CROSS REFERENCE TO RELATED APPLICATION

This application claims priority from Korean Patent Application No. 10-2006-0094297 filed on Sep. 27, 2006 in the Korean Intellectual Property Office, the disclosure of which is incorporated herein by reference in its entirety.

BACKGROUND OF THE INVENTION

1. Field of the Invention

Apparatuses and methods consistent with the present invention relate to a non-volatile memory supporting different cell types, and more particularly, to a mapping apparatus and method for a non-volatile memory supporting different cell types capable of mapping a logical address to a physical address in the non-volatile memory supporting different cell types in which bits represented by unit cells are different from each other.

2. Description of the Related Art

In general, non-volatile memories, serving as storage media for storing and processing data, have come into widespread use in embedded systems, such as electric home appliances, communication apparatuses, and set top boxes.

Flash memories mainly used as the non-volatile memories are non-volatile storage devices capable of electrically deleting data or restoring data, and are suitable for portable apparatuses having a small size since they have lower power consumption than storage media based on a magnetic disk memory and have a high access time like a hard disk.

In the flash memory, from the viewpoint of hardware characteristics, in order to perform a write operation on a memory sector having data written therein, an operation for deleting all blocks including the sector should be performed before the write operation. The erase-before-write operation causes the deterioration of the performance of the flash memory. In order to solve the problem, the concept of a logical address and a physical address has been introduced. That is, a read/write operation on the logical address is changed to a read/write operation on the physical address by various mapping algorithm, and then, the read/write operation is performed. In this case, the logical address is divided into an area for storing metadata that is frequently updated and an area for storing user data that has a larger size than the metadata and is less frequently updated than the metadata.

The flash memories are divided into several types according to the number of bits represented by one cell, from the viewpoint of hardware characteristics. For example, the flash memories are divided into two types, that is, a single level type (SLC) in which one bit is represented by one cell and a multi-level type (MLC) in which a plurality of bits are represented by one cell. The SLC type has a higher-speed read/write performance than the MLC type and also has a larger number of partial programming (NOP) than the MLC type. When the SLC type and the MLC type have the same physical size, the SLC type has a smaller storage capacity than the MLC type.

Since an apparatus having a non-volatile memory being currently produced is composed of only a single cell type, all physical addresses have the same performance and the same physical characteristic. Therefore, when a logical address is mapped to a physical address in a non-volatile memory supporting different cell types, characteristics of the physical address are not considered in each cell type, which results in restrictions in improving the performance of the non-volatile memory.

Japanese Unexamined Patent Application Publication No. 2004-062328 discloses a method of changing a data flow according to the amount of data and the erased state of a physical block in a NAND flash memory having a user physical block and an erase physical block.

SUMMARY OF THE INVENTION

An aspect of the present invention is to provide a mapping apparatus and method for a non-volatile memory supporting different cell types capable of improving the performance of the non-volatile memory supporting different cell types by mapping a logical address to a physical address considering characteristics of the physical addresses included in memory areas of each cell type in the non-volatile memory.

Aspects of the present invention are not limited to those mentioned above, and other aspects of the present invention will be apparently understood by those skilled in the art through the following description.

According to an aspect of the present invention, there is provided a mapping apparatus for a non-volatile memory supporting different cell types, the mapping apparatus including: a user request unit used for a user to request a predetermined operation by using a logical address; a non-volatile memory comprising a plurality of memory areas having different cell types; and a mapping management unit determining a physical address to be mapped to the logical address of one of the plurality of memory areas on the basis of the logical address used for the requested operation.

According to another aspect of the present invention, there is provided a mapping method for a non-volatile memory supporting different cell types, the method including: when a user requests a predetermined operation by using a logical address, determining a logical address area including the used logical address; and determining a physical address to be mapped to the used logical address in a non-volatile memory comprising a plurality of memory areas having different cell types.

Details of other exemplary embodiments of the invention are included in the detailed description of the invention and the drawings.

BRIEF DESCRIPTION OF THE DRAWINGS

The above and other features and aspects of the present invention will become more apparent by describing in detail exemplary embodiments thereof with reference to the attached drawings in which:

FIG. 4 is a diagram illustrating a method of mapping a physical address according to a logical address that is used when an operation is performed in a non-volatile memory supporting different cell types according to an exemplary embodiment of the invention;

FIG. 5 is a diagram illustrating the determination of a logical address that is used according to an access pattern to a user request unit according to an exemplary embodiment of the invention;

FIG. 6 is a flow chart illustrating a mapping method for a non-volatile memory supporting different cell types according to an exemplary embodiment of the invention; and FIG. 7 is a flow chart illustrating a mapping method for a non-volatile memory supporting different cell types according to an exemplary embodiment of the invention.

DESCRIPTION OF THE EXEMPLARY EMBODIMENTS

Figure 1:
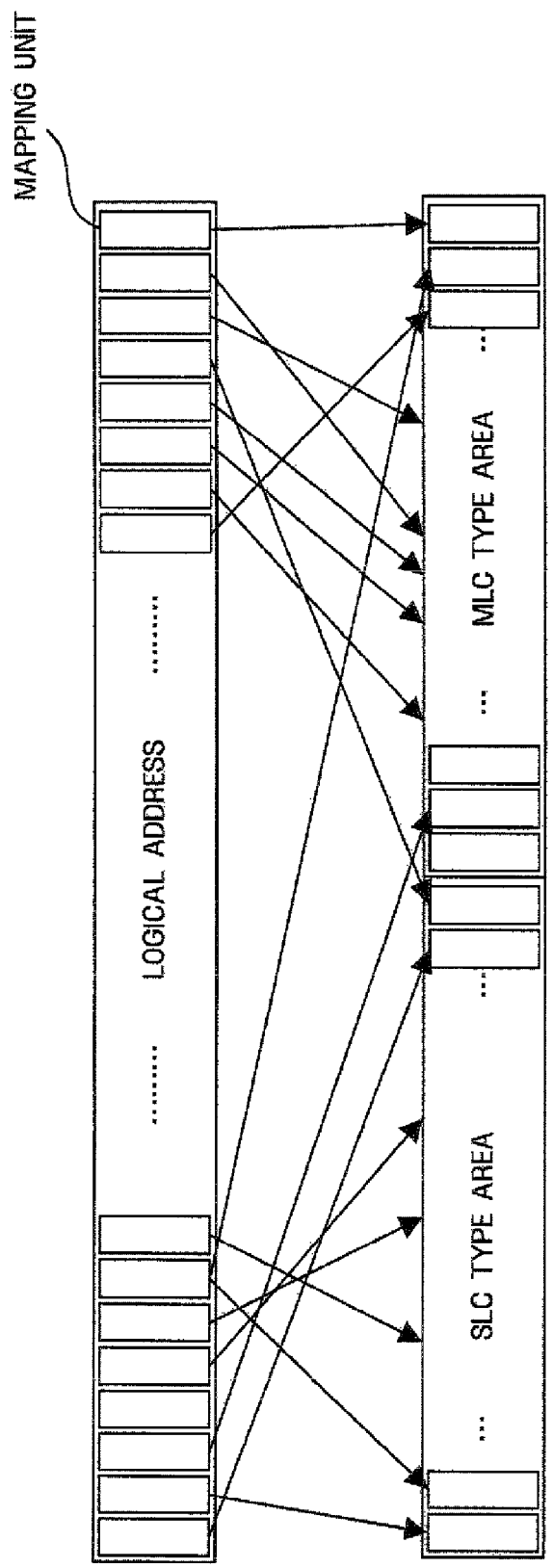
FIG. 1 is a diagram illustrating a mapping method in a general non-volatile memory.

Aspects and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the present invention will only be defined by the appended claims. Like reference numerals refer to like elements throughout the specification.

The present invention will be described hereinafter with reference to block diagrams or flowchart illustrations of a mapping apparatus and method for a non-volatile memory supporting different cell types according to exemplary embodiments thereof. It will be understood that each block of the flowchart illustrations, and combinations of blocks in the flowchart illustrations can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

And each block of the block diagrams may represent a module, segment, or portion of code, which comprises one or more executable instructions for implementing the specified logical function(s). It should also be noted that in some alternative implementations, the functions noted in the blocks may occur out of order. For example, two blocks shown in succession may in fact be executed substantially concurrently or the blocks may sometimes be executed in reverse order depending upon the functionality involved.

In general, in apparatuses each having a non-volatile memory supporting different types cell types, when a logical address is mapped to a physical address, characteristics for the physical address of each type of cells are not considered. Therefore, the logical address used for a predetermined operation is mapped through the same mapping algorithm as that used in, for example, an apparatus having a non-volatile memory supporting a single cell type regardless of the type of cell.

For example, when a non-volatile memory supports both an SLC type and an MLC type, as shown in FIG. 1, the logical address used for a predetermined operation is mapped through the same mapping algorithm as that used in a non-volatile memory supporting a single cell type. In this case, the mapping may be performed in the units of sectors, pages, or blocks, but the invention is not limited thereto.

When the characteristics for physical addresses of each cell type are not considered, it is difficult to appropriately use the characteristics of the SLC type, such as a high-speed read/write/erase operation and a large NOP, and the characteristics of the MLC type, such as a large storage capacity, which results in restrictions in improving the performance of the non-volatile memory.

Figure 2:
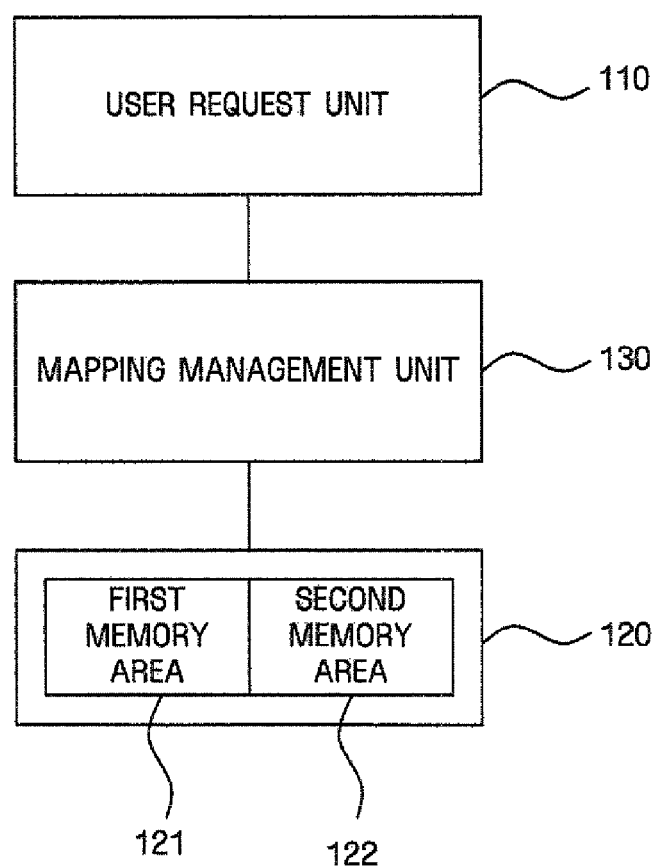
FIG. 2 is a diagram illustrating a mapping apparatus for a non-volatile memory supporting different cell types according to an exemplary embodiment of the invention.

Therefore, a mapping apparatus and method for a non-volatile memory supporting different cell types according to exemplary embodiments of the invention considers physical characteristics of each cell type in the non-volatile memory supporting different cell types to improve the performance of the non-volatile memory. FIG. 2 is a diagram illustrating a mapping apparatus for a non-volatile memory supporting different cell types according to an exemplary embodiment of the invention. In the following exemplary embodiments of the invention, a mapping apparatus for a non-volatile memory supporting different cell types is simply referred to as a "mapping apparatus".

As shown in FIG. 2, a mapping apparatus 100 according to the exemplary embodiment of the invention includes a user request unit 110 that is used for a user to request a predetermined operation using a predetermined logical address, a non-volatile memory 120 having a first memory area 121 of a first cell type and a second memory area 122 of a second cell type, and a mapping management unit 130 that maps the logical address used by a user to a physical address in the non-volatile memory 120 such that the operation requested by the user is performed in the non-volatile memory 120.

The user request unit 110 may be regarded as an application, such as a file system or a database management system (DMBS), that uses a storage device through a logical address. Therefore, the user can use a predetermined logical address to request a predetermined operation in the non-volatile memory through the application.

The non-volatile memory 120 may include the first memory area 121 and the second memory area 122 of different cell types that have different read/write/erase performances and NOPs. In this exemplary embodiment of the invention, the first memory area 121 is an SLC type, and the second memory type 122 is an MLC type. However, the invention is not limited thereto. For example, the first memory area 121 and the second memory area 122 may have various cell types under the condition that the first memory area 121 and the second memory area 122 having different read/write/erase performances and NOPs. In addition, in this exemplary embodiment of the invention, since the first memory area 121 is the SLC type, the first memory area 121 has a higher-speed read/write/erase performance and a larger NOP than the second memory area 122 of the MLC type.

The mapping management unit 130 may map the logical address used for the user request unit 110 to request an operation to one of the physical addresses of the first memory area 121 and the second memory area 122. In this exemplary embodiment of the invention, for example, a logical address area is divided into a first logical address area for metadata of an application that is frequently updated and a second logical address area for an application user data that is less frequently updated and has a larger size than the metadata. In addition, the mapping management unit 130 may perform mapping in the units of sectors, pages, or blocks, but the invention is not limited thereto.

Therefore, the mapping management unit 130 may determine whether to perform mapping to the physical address of the first memory area 121 or the second memory area 122 according to the logical address used for the user request unit 110 to request an operation. For example, it is assumed that the overall range of the logical address is from 0 to 1000, the first logical address area is in the range of 0 to 100, and the second logical address area is in the range of 101 to 1000. In this case, when the logical address used by the user request unit 110 is 50, the logical address is included in the first logical address area, and thus the mapping management unit 130 maps the logical address to the physical address of the first memory area 121. The mapping apparatus 100 according to the exemplary embodiment of the invention may obtain information on the logical address area in an initializing process and store the obtained information in a predetermined area of the non-volatile memory 120. In this case, the information on the logical address information may be stored in the first memory area 121 or the second memory area 122, or it may be stored in a separate memory area.

When the logical address used for the user request unit 110 to request an operation is 500, the logical address is included in the second logical address area, and thus the mapping management unit 130 may map the logical address to the physical address of the second memory area 121. As described above, in this exemplary embodiment of the invention, the logical address included in the first logical address area is mapped to the first memory area 121, and the logical address included in the second logical address area is mapped to the second memory area 122. However, the invention is not limited thereto. For example, when the physical addresses included in the first memory area 121 are larger than the logical addresses included in the first logical address area, the mapping management unit 130 may map the physical address included in the first memory area 121 to the logical address included in the second logical address area.

Figure 3:
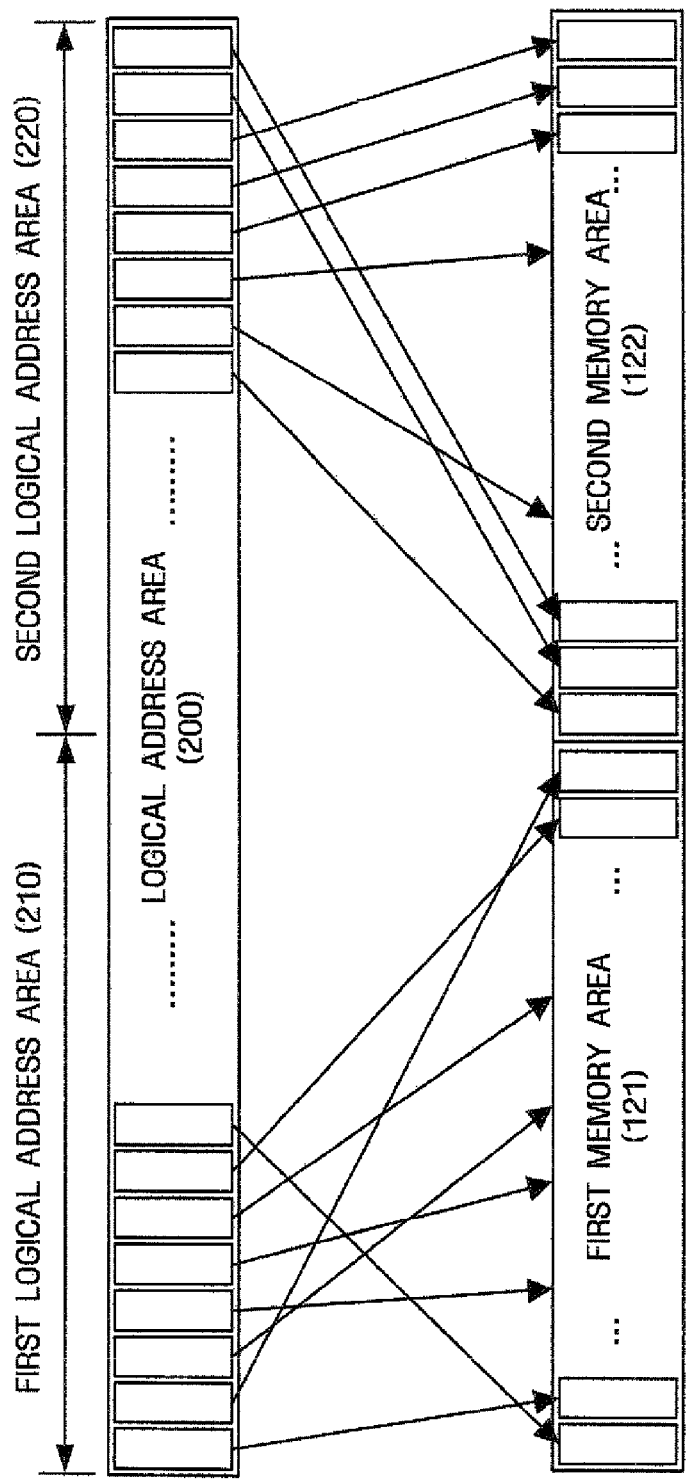
FIG. 3 is a diagram illustrating a method of mapping a physical address according to a logical address that is used when an operation is performed in a non-volatile memory supporting different cell types according to an exemplary embodiment of the invention.

Specifically, as shown in FIG. 3, the mapping management unit 130 may map the logical address included in a first logical address area 210 of a logical address area 200 to the physical address included in the first memory area 121 and the logical address included in a second logical address area 220 to the physical address of the second memory area 122.

As shown in FIG. 4, when the size of the first logical address area 210 is smaller than the size of the first memory area 121, the mapping management unit 130 may map the physical addresses remaining in the first memory area 121 to the logical addresses included in the second logical address area 220. In this exemplary embodiment of the invention, the size of the first logical address area 210 is smaller than the size of the first memory area 212, but the invention is not limited thereto. For example, when the size of the first logical address area 210 is larger than the size of the first memory area 212, the mapping management unit 130 may map the logical address included in the first logical address area 210 to the physical address included in the second memory area 122.

As described above, in this exemplary embodiment, the mapping management unit 130 maps the logical address to the physical address included in the first memory address 121 or the second memory address 122 according to the logical address area including the logical address used by the user request unit 110. However, the invention is not limited thereto. For example, it is possible to determine a memory area including the physical address to which the logical address is mapped according to an access pattern that is known by the user request unit 110. In the following exemplary embodiments of the invention, an access pattern to the metadata is referred to as a "first pattern", and an access pattern to the user data is referred to as a "second pattern".

For example, in a database in which the user data and the metadata are mixed with each other and the logical addresses of the user data and the metadata are not settled, when a user inputs to the mapping management unit 130 the first pattern or the second pattern related to a logical address corresponding to the user data and a logical address corresponding to the metadata in the data base, the mapping management unit 130 may determine the physical address to be mapped on the basis of the input pattern.

Specifically, as show in FIG. 5, the mapping management unit 130 may determine a logical address area including a logical address to be used in the logical address area 200 on the basis of the pattern input by the user, that is, the first pattern indicating the metadata or the second pattern indicating the user data. The mapping management unit 130 may also determine whether to map the logical address to the physical address of the first memory area 121 or the second memory area 122 on the basis of the determined logical address area.

As described above, in this exemplary embodiment of the invention, the mapping management unit 130 determines the physical address to be mapped on the basis of the logical address and the pattern. However, the invention is not limited thereto. For example, the mapping managing unit 130 may determine the physical address to be mapped on the basis of a mixture of the logical address and the pattern.

Next, a mapping method for a non-volatile memory supporting different cell types according to an exemplary embodiment of the invention will be described with reference to the drawings. Hereinafter, the mapping method for a non-volatile memory supporting different cell types according to the exemplary embodiment of the invention is simply referred to as a mapping method. In addition, the mapping method according to this exemplary embodiment of the invention may be divided into a first mapping method of performing mapping on the basis of information on the first logical address area and the second logical address area and a second mapping method of performing mapping on the basis of a user access pattern.

FIG. 6 is a flow chart illustrating the first mapping method according to the exemplary embodiment of the invention.

As shown in FIG. 6, in the first mapping method according to the exemplary embodiment of the invention, first, the mapping apparatus 100 shown in FIG. 2 is initialized and information on the logical address is stored in a predetermined area of the non-volatile memory 120 (S110). In this exemplary embodiment of the invention, the mapping management unit 130 initializes the mapping apparatus 100, but the invention is not limited thereto. For example, a separate component for initializing the mapping apparatus 100 may be provided. In this case, information on the stored logical address may include information on the first logical address area used for the metadata and the second logical address area used for the user data, but the invention is not limited thereto. In this exemplary embodiment, the initializing operation, such as S110, is performed before a predetermined operation is executed, but the invention is not limited thereto. For example, the initializing operation may be performed during the operation.

The user uses a predetermined logical address to request a predetermined operation (for example, read/write/erase operations) through the user request unit 110 (S120).

The mapping management unit 130 determines a logical address area including the logical address that is used to request the predetermined operation on the basis of the information on the logical address stored in operation S110 to decide a memory area in which the requested operation will be performed (S130).

When it is determined that the logical address used for the requested operation is included in the first logical address area, the mapping management unit 130 maps the physical address included in the first memory area 121 to the logical address used for the requested operation (S140).

When it is determined that the logical address used for the requested operation is included in the second logical address area, the mapping management unit 130 maps the physical address included in the second memory area 122 to the logical address used for the requested operation (S150).

FIG. 7 is a flow chart illustrating the second mapping method according to the exemplary embodiment of the invention.

As shown in FIG. 7, in the second mapping method according to the exemplary embodiment of the invention, first, the mapping apparatus 100 shown in FIG. 2 is initialized and information on the logical address is stored in a predetermined area of the non-volatile memory 120 (S210). In this exemplary embodiment of the invention, similar to the first mapping method shown in FIG. 6, the mapping management unit 130 initializes the mapping apparatus 100, but the invention is not limited thereto. For example, a separate component for initializing the mapping apparatus 100 may be provided. In this case, information on the stored logical address may include information on the first logical address area used for the metadata and the second logical address area used for the user data, but the invention is not limited thereto.

The user uses a predetermined logical address to request a predetermined operation (for example, read/write/erase operations) through the user request unit 110 (S220).

The mapping management unit 130 determines a logical address area including the logical address that is used to request the predetermined operation on the basis of the information on the logical address stored in operation S210 and the pattern input by the user to decide a memory area in which the requested operation will be performed (S230).

As the result of the determination, when an access pattern used for the requested operation is the first pattern, the mapping management unit 130 determines that the logical address used is included in the first logical address area, and maps the physical address included in the first memory area 121 to the logical address used for the requested operation (S240).

As the result of the determination, when an access pattern used for the requested operation is the second pattern, the mapping management unit 130 determines that the logical address used is included in the second logical address area, and maps the physical address included in the second memory area 122 to the logical address used for the requested operation (S250).

As described with reference to FIGS. 6 and 7, the physical address to be mapped to one of the first memory area 121 and the second memory area 122 is determined on the basis of the logical address used for a predetermined operation, that is, the type of data to be stored (for example, on the basis of application metadata and application user data). Therefore, according to this exemplary embodiment of the invention, it is possible to sufficiently consider physical characteristics of each memory area in a non-volatile memory supporting different cell types, which makes it possible to improve the performance of the non-volatile memory supporting different cell types.

The terms "unit" or "module" as used herein, refers to, but is not limited to, a software or hardware component, such as a field programmable gate array (FPGA) or an application specific integrated circuit (ASIC), which performs certain tasks. A module or unit may advantageously be configured to reside on the addressable storage medium and may be configured to execute on one or more processors. Thus, a module or unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules or units may be combined into fewer components and modules or units or further separated into additional components and modules or units.

Although the mapping apparatus and method for a non-volatile memory supporting different cell types according to the exemplary embodiments of the present invention have been described with reference to the accompanying drawings, it will be apparent to those skilled in the art that various modifications and changes may be made thereto without departing from the scope and spirit of the invention. Therefore, it should be understood that the above exemplary embodiments are not limitative, but illustrative in all aspects.

As described above, according to the mapping apparatus and method for a non-volatile memory supporting different cell types of the exemplary embodiments of the invention, it is possible to improve the operational performance of a non-volatile memory supporting different cell types considering characteristics of physical addresses included in memory areas of each cell type.

What is claimed is:

1. A mapping apparatus for a non-volatile memory supporting different cell types, comprising:
   a user request unit which requests a predetermined operation by using a logical address;
   a non-volatile memory comprising a plurality of memory areas having different cell types; and
   a mapping management unit which determines a physical address to be mapped to the logical address, of one of the plurality of memory areas based on a first logical address area including the logical address in a logical address space used for the requested predetermined operation,
   wherein the first logical address area in said logical address space is determined based on information stored in a predetermined area of the non-volatile memory, wherein the non-volatile memory comprises a first memory area of a first cell type and a second memory area of a second cell type, wherein the logical address space comprises the first logical address area and a second logical address area, and
   the mapping management unit uses at least one of a first mapping and a second mapping, wherein the first mapping maps a logical address included in the first logical address area and a logical address included in the second logical address area to a physical address included in the first memory area and determined based on at least one physical characteristic of a cell type of the physical address included in the first memory area and a physical address included in the second memory area and determined based on at least one physical characteristic of a cell type of the physical address included in the second memory area, respectively, and the second mapping maps a logical address to a physical address included in the first memory area or the second memory area based on an access pattern that is known by the user request unit.

2. The mapping apparatus of claim 1, wherein:
the first memory area is a single level cell (SLC) type, and the second memory area is a multi-level cell (MLC) type.

3. The mapping apparatus of claim 1, wherein data stored in the first memory area is more frequently updated than data stored in the second memory area.

4. The mapping apparatus of claim 1, wherein, if a number of physical addresses included in the first memory area is larger than a number of logical addresses included in the first logical address area, the mapping management unit maps remaining physical addresses included in the first memory area to logical addresses included in the second logical address area.

5. The mapping apparatus of claim 1, wherein, if a number of physical addresses included in the first memory area is smaller than a number of logical addresses included in the first logical address area, the mapping management unit maps remaining logical addresses included in the first logical address area to physical addresses included in the second memory area.

6. The mapping apparatus of claim 1, wherein data corresponding to the first logical address area is more frequently updated than data corresponding to the second logical address area.

7. The mapping apparatus of claim 1, wherein the second logical address area in said logical address space is determined based on information stored in said predetermined area of the non-volatile memory.

8. The mapping method of claim 1, wherein the first memory area of the first cell type has different performance capabilities and different numbers of partial programming relative to the second memory area of the second cell type.

9. The mapping method of claim 1, wherein the information stored in the predetermined area of the non-volatile memory is related to the first logical address area and is obtained during an initialization process.

10. A mapping method for a non-volatile memory supporting different cell types, the method comprising:
if a user requests a predetermined operation by using a logical address, determining a first logical address area including the used logical address in a logical address space; and
determining a physical address dedicated to the logical address and to be mapped to the logical address, in a non-volatile memory including a plurality of memory areas having different cell types based on the determined first logical address area,
wherein the first logical address area in said logical address space is determined based on information stored in a predetermined area of the non-volatile memory, wherein the non-volatile memory includes a first memory area of a first cell type and a second memory area of a second cell type, wherein the logical address space comprises the first logical address area and a second logical address area, and the mapping management unit uses at least one of a first mapping and a second mapping, wherein the first mapping maps a logical address included in the first logical address area and a logical address included in the second logical address area to a physical address included in the first memory area and determined based on at least one physical characteristic of a cell type of the physical address included in the first memory area and a physical address included in the second memory area and determined based on at least one physical characteristic of a cell type of the physical address included in the second memory area, respectively, and the second mapping maps a logical address to a physical address included in the first memory area or the second memory area based on an access pattern that is known by the user request unit.

11. The mapping method of claim 10, wherein:
the first memory area is a single level cell (SLC) type, and the second memory area is a multi-level cell (MLC) type.

12. The mapping method of claim 10, wherein data stored in the first memory area is more frequently updated than data stored in the second memory area.

13. The mapping method of claim 10, wherein, if a number of physical addresses included in the first memory area is larger than a number of logical addresses included in the first logical address area, the determining of the physical address to be mapped maps remaining physical addresses included in the first memory area to logical addresses included in the second logical address area.

14. The mapping method of claim 10, wherein, if a number of physical addresses included in the first memory area is smaller than a number of logical addresses included in the first logical address area, the determining of the physical address to be mapped maps remaining logical addresses included in the first logical address area to physical addresses included in the second memory area.

15. The mapping method of claim 10, wherein data corresponding to the first logical address area is more frequently updated than data corresponding to the second logical address area.

16. The mapping method of claim 10, wherein the second logical address area in said logical address space is determined based on information stored in said predetermined area of the non-volatile memory.

17. The mapping method of claim 10, wherein the first memory area of the first cell type has different performance capabilities and different numbers of partial programming relative to the second memory area of the second cell type.

18. The mapping method of claim 10, wherein the information stored in the predetermined area of the non-volatile memory is related to the first logical address area and is obtained during an initialization process.

* * * * *